(12) United States Patent
Miyamichi et al.

(10) Patent No.: US 9,698,288 B2
(45) Date of Patent: Jul. 4, 2017

(54) PHOTOELECTRIC CONVERSION DEVICE

(71) Applicant: KYOCERA Corporation, Fushimi-ku, Kyoto-shi, Kyoto (JP)

(72) Inventors: Yusuke Miyamichi, Hikone (JP); Tatsuya Domoto, Higashiomi (JP); Yuji Asano, Higashiomi (JP); Rui Kamada, Atsugi (JP)

(73) Assignee: KYOCERA Corporation, Kyoto (JP)

(*) Notice: Subject to any disclaimer, the term of this patent is extended or adjusted under 35 U.S.C. 154(b) by 0 days.

(21) Appl. No.: 14/375,126

(22) PCT Filed: Dec. 25, 2012

(86) PCT No.: PCT/JP2012/083510
§ 371 (c)(1),
(2) Date: Jul. 28, 2014

(87) PCT Pub. No.: WO2013/111495
PCT Pub. Date: Aug. 1, 2013

(65) Prior Publication Data
US 2014/0366944 A1    Dec. 18, 2014

(30) Foreign Application Priority Data
Jan. 27, 2012 (JP) .................... 2012-015095

(51) Int. Cl.
*H01L 31/0368* (2006.01)
*H01L 31/0465* (2014.01)
(Continued)

(52) U.S. Cl.
CPC ...... *H01L 31/0368* (2013.01); *H01L 31/0322* (2013.01); *H01L 31/03923* (2013.01);
(Continued)

(58) Field of Classification Search
CPC . H01L 31/0264; H01L 31/04; H01L 31/0272; H01L 31/032; H01L 31/0322;
(Continued)

(56) References Cited

U.S. PATENT DOCUMENTS 8,106,292 B2* 1/2012 Cumpston ......... H01L 31/03528
136/251
2005/0056312 A1* 3/2005 Young ................ H01L 31/0749
136/258

(Continued)

FOREIGN PATENT DOCUMENTS

JP   7-258881 A   10/1995
JP   07258881 A * 10/1995
(Continued)

OTHER PUBLICATIONS

Partial Translation of WO2011108033, Compound Thin Film Solar Cell and Method for Manufacturing Same, Nakagawa, Naoyuki, 2011.*

(Continued)

*Primary Examiner* — Allison Bourke
*Assistant Examiner* — Michael Y Sun
(74) *Attorney, Agent, or Firm* — Procopio Cory Hargreaves and Savitch LLP

(57) ABSTRACT

In order to improve the photoelectric conversion efficiency of a photoelectric conversion device, this photoelectric conversion device is provided with an electrode layer, a first semiconductor layer that is positioned on the electrode layer and contains a polycrystalline semiconductor, and a second semiconductor layer that is positioned on/above the first semiconductor layer and forms a p-n junction with the first semiconductor layer, and an average grain diameter of crystal grains in the first semiconductor layer is larger near the surface on the electrode layer side of the first semicon- (Continued)

ductor layer than the center of the first semiconductor layer in a thickness direction of the first semiconductor layer. Furthermore, the average grain diameter of the crystal grains in the first semiconductor layer is larger in a surface portion on the second semiconductor layer side of the first semiconductor layer than in the central portion.

5 Claims, 3 Drawing Sheets

(51) Int. Cl.
*H01L 31/0392* (2006.01)
*H01L 31/032* (2006.01)

(52) U.S. Cl.
CPC .... *H01L 31/03925* (2013.01); *H01L 31/0465* (2014.12); *Y02E 10/541* (2013.01)

(58) Field of Classification Search
CPC ... H01L 31/0749; H01L 31/042; H01L 31/00; H01L 31/0368; H01L 31/0465; H01L 31/03925; H01L 31/03923; H01L 31/036; H01L 31/035281; H01L 31/046; H01L 31/0475; H01L 31/048; H01L 21/02568; H01L 21/02557; H01L 21/02474; H01L 21/02477; H01L 21/02485; H01L 21/0256; H01L 21/0268; H01L 21/02551; H01L 21/02601; H01L 21/02628; Y02E 10/541; Y02E 10/50; Y02P 70/521

USPC ........................................................ 136/256
See application file for complete search history.

(56) References Cited

U.S. PATENT DOCUMENTS

| 2010/0078056 A1* | 4/2010 | Hovel | H01L 31/042 |
| | | | 136/244 |
| 2011/0308616 A1* | 12/2011 | Kamada | H01L 31/0322 |
| | | | 136/262 |
| 2014/0261651 A1* | 9/2014 | Whitelegg | H01L 31/0322 |
| | | | 136/255 |

FOREIGN PATENT DOCUMENTS

| JP | 2000-299486 A | 10/2000 |
| JP | 2011-249560 A | 12/2011 |
| WO | 2011/108033 A1 | 9/2011 |
| WO | WO2011108033 * | 9/2011 |

OTHER PUBLICATIONS

International Search report and Written Opinion of the International Searching Authority issued by Japan Patent Office for International Application No. PCT/JP2012/083510.
International Search report dated Apr. 2, 2013 issued for counterpart International Application No. PCT/JP2012/083510.
Extended European Search Report dated Aug. 26, 2015, issued in counterpart European Application No. 12 86 6499.

* cited by examiner

F I G . 1
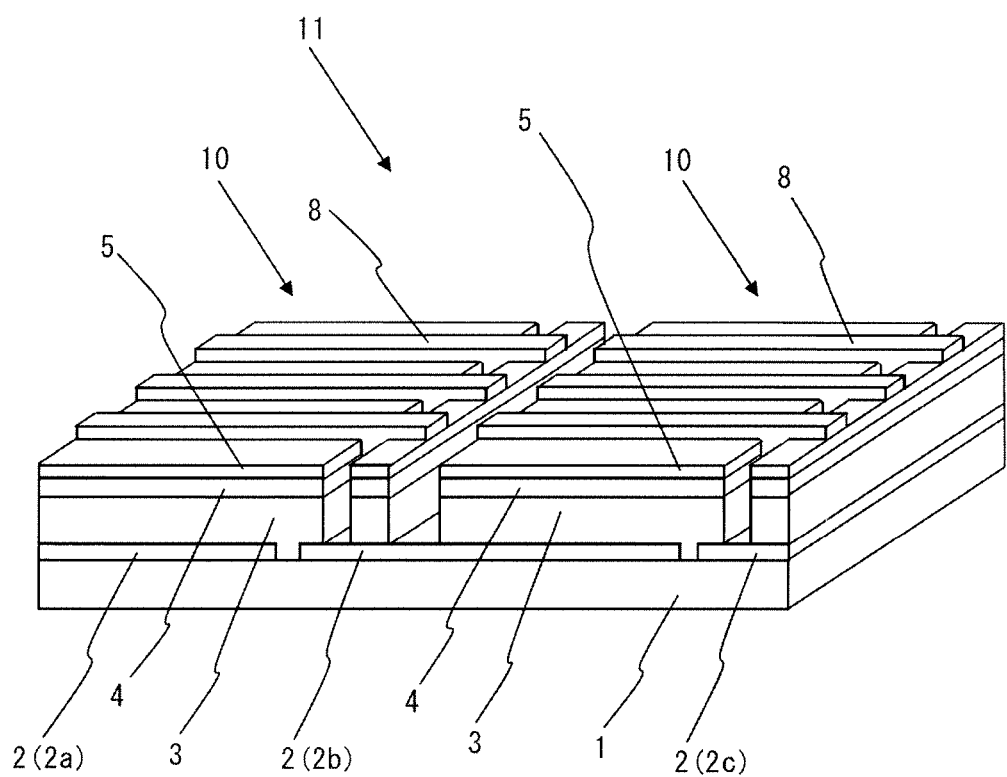

PHOTOELECTRIC CONVERSION DEVICE

TECHNICAL FIELD

The present invention relates to a photoelectric conversion device including a polycrystalline semiconductor.

BACKGROUND ART

As a photoelectric conversion device to be used for solar photovoltaic power generation, a device provided with a plurality of photoelectric conversion cells on a substrate is exemplified as disclosed in Japanese Unexamined Patent Application Publication No. 2000-299486.

Such a photoelectric conversion device is formed by two-dimensionally arranging a plurality of photoelectric conversion cells in which a lower electrode layer such as a metal electrode, a light-absorbing layer, a buffer layer, and a transparent conductive film are stacked in this order on a substrate such as glass. The plurality of photoelectric conversion cells are electrically connected in series by connecting the transparent conductive film of one of the adjacent photoelectric conversion cells and the lower electrode layer of the other of the adjacent photoelectric conversion cells through a connection conductor.

Improvement of photoelectric conversion efficiency is constantly demanded for the photoelectric conversion device. In the photoelectric conversion device, a method of increasing the size of crystal grains of a semiconductor layer serving as a light-absorbing layer may be considered as a method for improving the photoelectric conversion efficiency. However, when the size of the crystal grains of the semiconductor layer is increased, cracks easily appear on the semiconductor layer due to thermal stress or the like and it is difficult to sufficiently improve the photoelectric conversion efficiency.

SUMMARY OF INVENTION

An object of the present invention is to improve photoelectric conversion efficiency of a photoelectric conversion device.

A photoelectric conversion device according to an embodiment of the present invention comprises an electrode layer; a first semiconductor layer disposed on the electrode layer and including a polycrystalline semiconductor; and a second semiconductor layer disposed on/above the first semiconductor layer and forming a pn junction with the first semiconductor layer. An average grain diameter of crystal grains in the first semiconductor layer is larger in a surface portion on the electrode layer side of the first semiconductor layer than in a central portion of the first semiconductor layer in a thickness direction of the first semiconductor layer. Furthermore, the average grain diameter of the crystal grains in the first semiconductor layer is larger in a surface portion on the second semiconductor layer side of the first semiconductor layer than in the central portion.

According to the present invention, the photoelectric conversion efficiency in the photoelectric conversion device is improved.

BRIEF DESCRIPTION OF DRAWINGS

FIG. 1 is a perspective view illustrating an example of a photoelectric conversion device according to an embodiment.

DESCRIPTION OF EMBODIMENTS

Hereinafter, a photoelectric conversion device according to an embodiment of the present invention will be described in detail with reference to the drawings.

<Configuration of Photoelectric Conversion Device>

Figure 2:
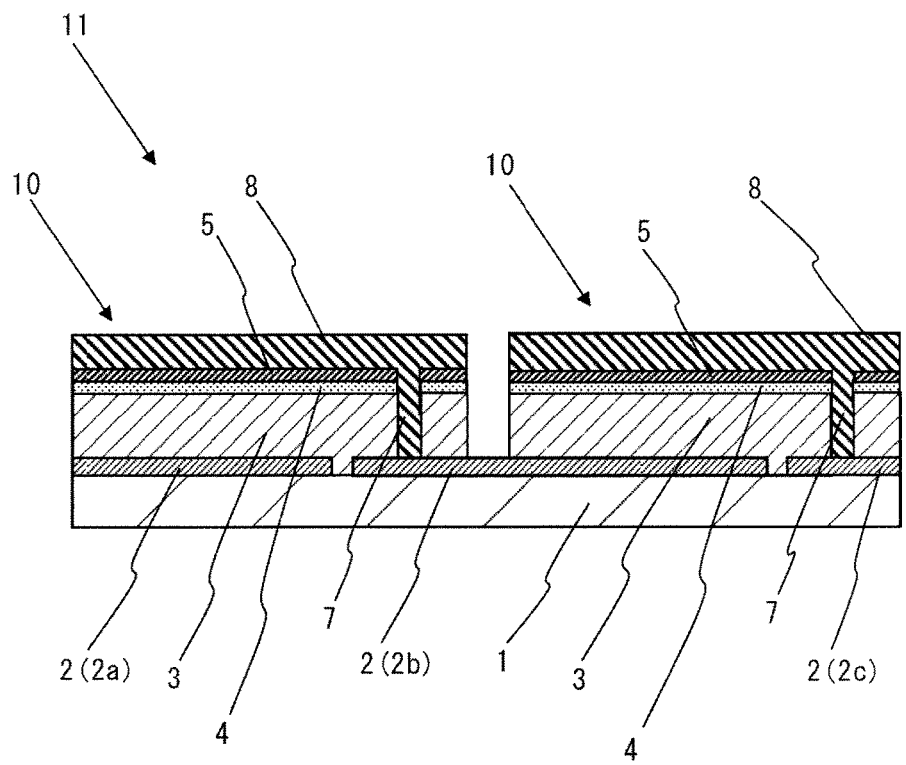
FIG. 2 is a cross-sectional view of the photoelectric conversion device illustrated in FIG. 1.

FIG. 1 is a perspective view illustrating an example of a photoelectric conversion device according to an embodiment of the present invention and FIG. 2 is a cross-sectional view thereof. In a photoelectric conversion device 11, a plurality of photoelectric conversion cells 10 are arranged on a substrate 1 and are electrically connected to one another. Although only two photoelectric conversion cells 10 are illustrated in FIG. 1 for convenience of illustration, multiple photoelectric conversion cells 10 may be two-dimensionally arranged in the right-left direction in FIG. 1 and further in a direction perpendicular to the right-left direction in the actual photoelectric conversion device 11.

In FIGS. 1 and 2, a plurality of lower electrode layers 2 are two-dimensionally arranged on the substrate 1. In FIGS. 1 and 2, the plurality of lower electrode layers 2 include lower electrode layers 2a to 2c arranged in one direction with a gap between them. A first semiconductor layer 3 is disposed over the lower electrode layer 2a and the lower electrode layer 2b through a portion on the substrate 1. In addition, a second semiconductor layer 4 whose conductivity type is different from that of the first semiconductor layer 3 is disposed on the first semiconductor layer 3. Further, a connection conductor 7 is disposed on the lower electrode layer 2b along the surface (side surface) of the first semiconductor layer 3 or by penetrating the first semiconductor layer 3. The connection conductor 7 electrically connects the second semiconductor layer 4 and the lower electrode layer 2b. One photoelectric conversion cell 10 is formed of the lower electrode layer 2, the first semiconductor layer 3, and the second semiconductor layer 4, and a high-output photoelectric conversion device 11 is configured by connecting adjacent photoelectric conversion cells 10 in series through the connection conductor 7. In addition, in the photoelectric conversion device 11 in the present embodiment, it is assumed that light is incident from the second semiconductor layer 4 side, but without being limited thereto, light may be incident from the substrate 1 side.

The substrate 1 supports the photoelectric conversion cells 10. Examples of a material to be used for the substrate 1 include glass, ceramics, resins, metals, and the like. As the substrate 1, soda lime glass having a thickness of approximately 1 mm to 3 mm can be used.

The lower electrode layers 2 (lower electrode layers 2a, 2b, and 2c) are conductors such as Mo, Al, Ti, or Au disposed on the substrate 1. The lower electrode layers 2 are formed to have a thickness of approximately 0.2 μm to 1 μm using a known thin film forming method such as a sputtering method or a deposition method.

The first semiconductor layer 3 includes a semiconductor having a polycrystalline structure. The first semiconductor layer 3 has a thickness of, for example, approximately 1 µm to 3 µm. Examples of the first semiconductor layer 3 include metal chalcogenide such as a group II-VI compound, a group I-III-VI compound, and a group I-II-IV-VI compound.

The group II-VI compound is a compound semiconductor of group II-B elements (also referred to as group 12 elements) and group VI-B elements (also referred to as group 16 elements). As the group II-VI compound, CdTe and the like are exemplified.

The group I-III-VI compound is a compound of group I-B elements (also referred to as group 11 elements), group III-B elements (also referred to as group 13 elements), and group VI-B elements. Examples of the group I-III-VI compound include $CuInSe_2$ (copper indium diselenide, also referred to as CIS), $Cu(In,Ga)Se_2$ (copper indium gallium diselenide, also referred to as CIGS), and $Cu(In,Ga)(Se,S)_2$ (copper indium gallium diselenide disulfide, also referred to as CIGSS). Alternatively, the first semiconductor layer 3 may be formed of a multiple compound semiconductor thin film such as copper indium gallium diselenide provided with a thin copper indium gallium diselenide disulfide layer as a surface layer.

The group I-II-IV-VI compound is a compound of group I-B elements, group II-B elements, group IV-B elements (also referred to as group 14 elements), and group VI-B elements. Examples of the group I-II-IV-VI compound include $Cu_2ZnSnS_4$ (also referred to as CZTS), $Cu_2ZnSn(S,Se)_4$ (also referred to as CZTSSe), and $Cu_2ZnSnSe_4$ (also referred to as CZTSe).

Further, the average grain diameter of crystal grains of the first semiconductor layer 3 is larger in the surface portion on the lower electrode layer 2 side than in the central portion of the first semiconductor layer 3 in the thickness direction (stacking direction). With such a configuration, occurrence of cracks or the like can be reduced by decreasing stress in the central portion having relatively small crystal grains, and recombination of charges at the grain boundaries is suppressed with relatively large crystal grains in the surface portion on the lower electrode layer 2 side, and thus charge mobility can be improved. Accordingly, the photoelectric conversion efficiency of the photoelectric conversion device 11 is improved.

Regarding the first semiconductor layer 3, it is at least desired that the average grain diameter of crystal grains of the surface portion on the lower electrode layer 2 side is larger than that of the crystal grains of the central portion, in a case where the first semiconductor layer 3 is assumed to be divided into the surface portion on the lower electrode layer 2 side, the central portion, and the surface portion on the second semiconductor layer 4 side by being trisected in the thickness direction.

The average grain diameter of crystal grains is acquired as follows. First, in regard to the cross sections of respective layers trisected as described above, images (also referred to as cross-sectional images) are obtained by photographing 10 arbitrary sites without concentrating at particular regions with a scanning electron microscope (SEM). Next, grain diameters of a plurality of grains are determined using image processing software or the like, from electronic data of the images or data in which the photographed images are captured by a scanner, and the average grain diameters of the crystal grains are calculated by acquiring the average value thereof.

The average grain diameter of crystal grains in the surface portion on the lower electrode layer 2 side of the first semiconductor layer 3 may be, for example, 100 nm to 500 nm from a viewpoint of improving an adhesion property between the first semiconductor layer 3 and the lower electrode layer 2. Further, the average grain diameter of crystal grains in the central portion may be 0.2 times to 0.5 times of the average grain diameter of crystal grains in the surface portion on the lower electrode layer 2 side.

Figure 3:
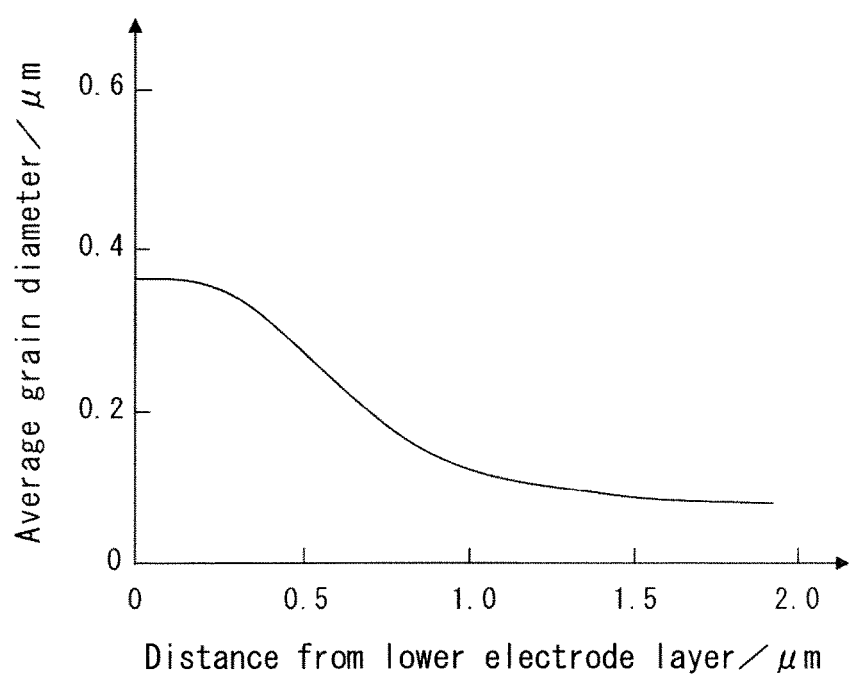
FIG. 3 is a graph illustrating distribution of the average grain diameter of crystal grains of a first semiconductor layer.

The average grain diameter of crystal grains in the first semiconductor layer 3 may gradually become larger toward the lower electrode layer 2 from the central portion from a viewpoint of reducing strain in the first semiconductor layer 3. For example, FIG. 3 illustrates an example of distribution of the average grain diameter of crystal grains of the first semiconductor layer 3 in the thickness direction. In FIG. 3, the horizontal axis represents a distance from the lower electrode layer 2 and the vertical axis represents the average grain diameter of crystal grains. With the average grain diameter of crystal grains being changed to be larger toward the lower electrode layer 2 as just described, it is possible to reduce the occurrence of strain in the first semiconductor layer 3 and the occurrence of cracks or separation of the first semiconductor layer 3 can be further reduced. Further, the distribution of the average grain diameter of crystal grains in the thickness direction can be acquired by dividing the first semiconductor layer 3 into a plurality of layers in the thickness direction and measuring the average grain diameter of the respective layers.

The second semiconductor layer 4 is a semiconductor layer of a second conductivity type which is different from the conductivity type of the first semiconductor layer 3. By electrically connecting the first semiconductor layer 3 and the second semiconductor layer 4, a photoelectric conversion layer with which charges are extracted well is formed. For example, in a case where the first semiconductor layer 3 is a p-type semiconductor layer, the second semiconductor layer 4 is an n-type semiconductor layer. The first semiconductor layer 3 may be an n-type semiconductor layer and the second semiconductor layer 4 may be a p-type semiconductor layer. Further, a high-resistance buffer layer may be interposed between the first semiconductor layer 3 and the second semiconductor layer 4.

Examples of the second semiconductor layer 4 include CdS, ZnS, ZnO, $In_2S_3$, $In_2Se_3$, In (OH,S), (Zn,In) (Se,OH), (Zn,Mg)O, and the like. The second semiconductor layer 4 is formed to have a thickness of 10 nm to 200 nm using, for example, a chemical bath deposition (CBD) method or the like. In addition, In(OH,S) means a mixed crystal compound containing In as a hydroxide and a sulfide. (Zn,In)(Se,OH) is a mixed crystal compound containing Zn and In as a selenide and a hydroxide. (Zn,Mg)O is a compound containing Zn and Mg as an oxide.

As illustrated in FIGS. 1 and 2, the upper electrode layer 5 may be further disposed on the second semiconductor layer 4. The upper electrode layer 5 is a layer with resistivity lower than that of the second semiconductor layer 4 and with which charges generated in the first semiconductor layer 3 and the second semiconductor layer 4 can be extracted well. From a viewpoint of further improving photoelectric conversion efficiency, the resistivity of the upper electrode layer 5 may be lower than 1 Ω·cm and the sheet resistance thereof may be equal to or lower than 50 Ω/□.

The upper electrode layer 5 is a transparent conductive film having a thickness of 0.05 m to 3 m made of ITO or ZnO, or the like, for example. For improving translucency and conductivity, the upper electrode layer 5 may be formed of a semiconductor having the same conductivity type as that of the second semiconductor layer 4. The upper electrode layer 5 may be formed by a sputtering method, an evaporation method, a chemical vapor deposition (CVD) method, or the like.

Further, as illustrated in FIGS. 1 and 2, a collector electrode 8 may be further formed on the upper electrode layer 5. The collector electrode 8 is an electrode for further efficiently extracting charges generated in the first semiconductor layer 3 and the second semiconductor layer 4. The collector electrode 8 is formed, for example, linearly from one end of the photoelectric conversion cell 10 to the connection conductor 7 as illustrated in FIG. 1. Accordingly, the current generated in the first semiconductor layer 3 and the second semiconductor layer 4 is collected in the collector electrode 8 through the upper electrode layer 5, and is efficiently passed to the adjacent photoelectric conversion cells 10 through the connection conductor 7.

The collector electrode 8 may have a width of 50 μm to 400 μm from a viewpoint of improving light transmittance to the first semiconductor layer 3 and having good conductivity. Further, the collector electrode 8 may include a plurality of branched portions.

The collector electrode 8 is formed by, for example, preparing a metal paste which is obtained by dispersing metal powder such as Ag powder in a resin binder or the like, printing the metal paste into a pattern shape, and curing the metal paste.

In FIGS. 1 and 2, the connection conductor 7 is a conductor disposed in a groove penetrating the first semiconductor layer 3, the second semiconductor layer 4, and the upper electrode layer 5. A metal, a conductive paste, or the like can be used for the connection conductor 7. In FIGS. 1 and 2, the connection conductor 7 is formed by extending the collector electrode 8, but not limited thereto. For example, the connection conductor 7 may be formed by extending the upper electrode layer 5.

<Method for Producing Photoelectric Conversion Device>

Next, a method for producing the photoelectric conversion device 11 having the above-described configuration will be described. Here, a case in which the first semiconductor layer 3 is made of CIGS will be described. First, the lower electrode layer 2, which is formed of Mo or the like, is formed into a desired pattern using a sputtering method or the like on a main surface of the substrate 1 formed of glass or the like.

In addition, a precursor layer which becomes the first semiconductor layer 3 is formed on the lower electrode layer 2 with a sputtering method, a coating method, or the like. The precursor layer may be a layer containing a raw material of a compound constituting the first semiconductor layer 3 or a layer containing fine grains of a compound constituting the first semiconductor layer 3.

Subsequently, the precursor layer is subjected to a heat treatment at a temperature of 500° C. to 600° C. During the heat treatment, a portion on the lower electrode layer 2 side of the precursor layer is subjected to active heat treatment by being irradiated with infrared light from the substrate 1 side using an IR lamp. Accordingly, the first semiconductor layer 3 whose average grain diameter is larger in the surface portion on the lower electrode layer 2 side than in the central portion in the thickness direction is formed.

After the first semiconductor layer 3 is formed, the second semiconductor layer 4 and the upper electrode layer 5 are sequentially formed on the first semiconductor layer 3 using a CBD method, a sputtering method, or the like. In addition, the first semiconductor layer 3, the second semiconductor layer 4, and the upper electrode layer 5 are processed through a mechanical scribing process or the like and consequently a groove for the connection conductor 7 is formed.

Thereafter, for example, conductive paste, which is obtained by dispersing metal powder such as Ag powder in a resin binder or the like, is printed in a pattern shape on the upper electrode layer 5 and in the groove, and the collector electrode 8 and the connection conductor 7 are formed by heating and curing the printed conductive paste.

Finally, the first semiconductor layer 3 to the collector electrode 8 are removed at a position shifted from the connection conductor 7 through a mechanical scribing process so as to provide a plurality of photoelectric conversion cells 10 being divided, thereby obtaining the photoelectric conversion device 11 illustrated in FIGS. 1 and 2.

<Modification Example of Photoelectric Conversion Device>

It should be noted that the present invention is not limited to the above-described embodiment, and various changes and modifications are possible without departing from the scope of the present invention.

Figure 4:
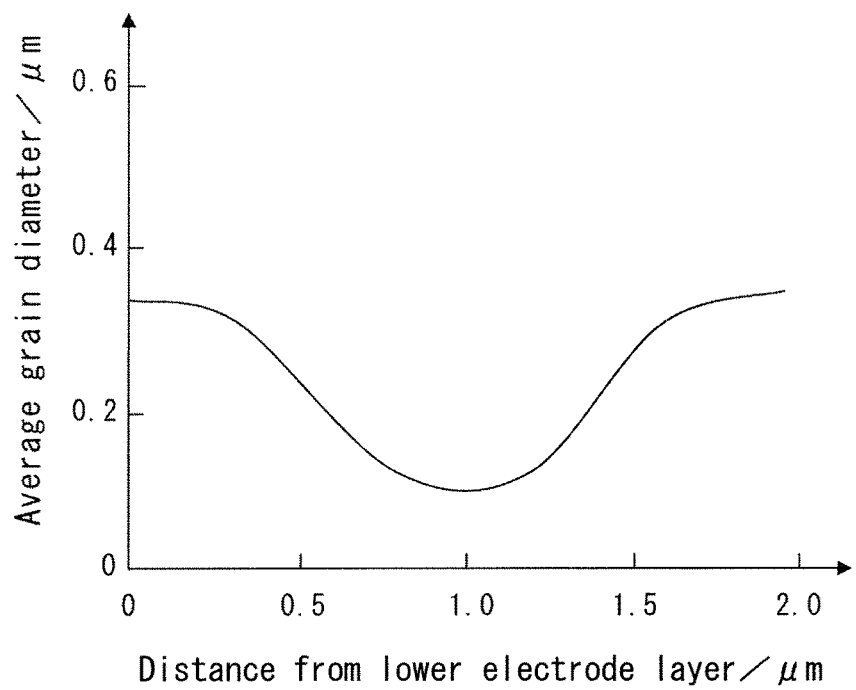
FIG. 4 is a graph illustrating distribution of the average grain diameter of crystal grains of a first semiconductor layer in another example of the photoelectric conversion device.

For example, the average grain diameter of crystal grains in the first semiconductor layer 3 may be larger in the surface portion on the second semiconductor layer 4 side than in the central portion of the first semiconductor layer 3 in the thickness direction. As a result, recombination of charges at the grain boundaries can be suppressed in the surface portion on the second semiconductor layer 4 side. Consequently, the photoelectric conversion efficiency of the photoelectric conversion device 11 can be further improved. Particularly, as illustrated in FIG. 4, when the average grain diameter of crystal grains in the first semiconductor layer 3 gradually becomes larger toward the second semiconductor layer 4 from the central portion, occurrence of strain in the first semiconductor layer 3 can be suppressed well. FIG. 4 illustrates distribution of the average grain diameter of crystal grains of the first semiconductor layer 3 in the thickness direction in the same manner as FIG. 3. Such first semiconductor layer 3 becomes the first semiconductor layer 3 whose average grain diameter is larger in the surface portion on the second semiconductor layer 4 side than in the central portion in the thickness direction by being irradiated with the infrared light from the surface of the precursor layer opposite the lower electrode layer 2 using an IR lamp, when the above-described precursor layer is heated and consequently the first semiconductor layer 3 is formed.

Figure 5:
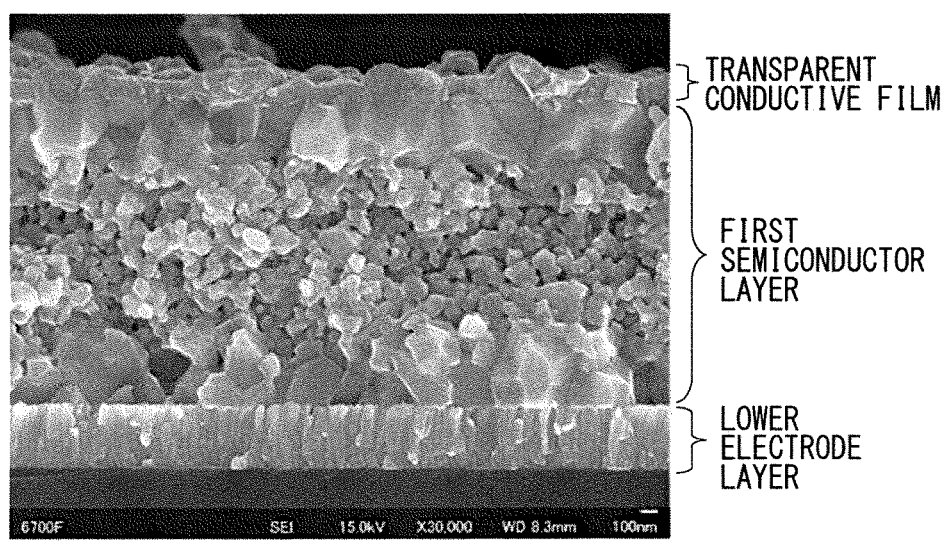
FIG. 5 is a photograph of a cross section of the first semiconductor layer in another example of the photoelectric conversion device.

An example of a photograph of the cross section of the above-described first semiconductor layer 3 is illustrated in FIG. 5. FIG. 5 is a cross section of the photoelectric conversion device 11 in which Mo is used for the lower electrode layer 2, CIGS is used for the first semiconductor layer 3, In(OH,S) is used for the second semiconductor layer (because of the thinness, it is difficult to be confirmed in FIG. 5), and AZO is used for the transparent conductive film.

REFERENCE SIGNS LIST

1 Substrate
2, 2a, 2b, 2c Lower Electrode Layer
3 First Semiconductor Layer
4 Second Semiconductor Layer
7 Connection Conductor
10 Photoelectric Conversion Cell
11 Photoelectric Conversion Device

The invention claimed is:
1. A photoelectric conversion device, comprising:
an electrode layer;

a first semiconductor layer disposed on the electrode layer and including a polycrystalline semiconductor; and a second semiconductor layer disposed on/above the first semiconductor layer and forming a pn junction with the first semiconductor layer, wherein the first semiconductor layer is located between the electrode layer and the second semiconductor layer, such that the electrode layer is positioned on an electrode layer side of the first semiconductor layer, and the second semiconductor layer is positioned on a second semiconductor layer side of the first semiconductor layer, wherein the electrode layer side is opposite to the second semiconductor layer side, wherein an average grain diameter of crystal grains in the first semiconductor layer is larger in a surface portion on the electrode layer side of the first semiconductor layer than in a central portion of the first semiconductor layer in a thickness direction of the first semiconductor layer, and the average grain diameter of the crystal grains in the first semiconductor layer is larger in a surface portion on the second semiconductor layer side of the first semiconductor layer than in the central portion, wherein the average grain diameter of crystal grains in the central portion of the first semiconductor layer is 100 nm or more, wherein the average grain diameter of crystal grains in the central portion of the first semiconductor layer is 0.2 times to 0.5 times the average grain diameter of crystal grains in the surface portion on the electrode layer side of the first semiconductor layer, and wherein the photoelectric conversion device is planar.

2. The photoelectric conversion device according to claim 1, wherein the average grain diameter of crystal grains in the first semiconductor layer gradually becomes larger toward the electrode layer from the central portion.

3. The photoelectric conversion device according to claim 1, wherein the average grain diameter of the crystal grains in the first semiconductor layer gradually becomes larger toward the second semiconductor layer from the central portion.

4. The photoelectric conversion device according to claim 3, wherein the average grain diameter of the crystal grains in the first semiconductor layer gradually becomes larger toward the electrode layer from the central portion.

5. The photoelectric conversion device according to claim 1, wherein the first semiconductor layer is formed of a group I-III-VI compound.

* * * * *